United States Patent [19]

Duijkers

[11] 4,415,869

[45] Nov. 15, 1983

[54] SAWTOOTH GENERATOR SWITCHABLE BETWEEN A FREE-RUNNING STATE OR A SYNCHRONIZABLE STATE

[75] Inventor: Peter A. Duijkers, Nijmegen, Netherlands

[73] Assignee: U.S. Philips Corporation, New York, N.Y.

[21] Appl. No.: 282,355

[22] Filed: Jul. 13, 1981

Related U.S. Application Data

[63] Continuation of Ser. No. 89,006, Oct. 29, 1979, abandoned.

[30] Foreign Application Priority Data

Nov. 27, 1978 [NL] Netherlands ............... 7811597

[51] Int. Cl.³ .............................................. H03K 3/26
[52] U.S. Cl. ................................. 331/111; 307/228; 328/185
[58] Field of Search ............... 331/111; 307/228; 328/181, 183, 185; 358/159

[56] References Cited

U.S. PATENT DOCUMENTS

| 3,577,007 | 5/1971 | Cross | 328/185 X |
| 3,866,062 | 2/1975 | Feindt | 328/185 X |
| 4,047,052 | 9/1977 | Koubek et al. | 328/185 X |

OTHER PUBLICATIONS

Freyberger, "Integrated Field Time Base Circuit for Television Receivers", vol. 31, No. 9, pp. 260, 262-265, 268, Funk-Technik, May 1976.
Cairns, "Linear Ramp Generator", pp. 604-605, Wireless World, Dec. 1971.
Wisotsky, "COS/MOS-Gatter schalten Sägezahn-Generator", vol. 23, No. 10, pp. 376-378, Elektronik, Oct. 1974.

Primary Examiner—Siegfried H. Grimm
Assistant Examiner—Edward P. Westin
Attorney, Agent, or Firm—Thomas A. Briody; William J. Streeter

[57] ABSTRACT

A sawtooth voltage oscillator synchronizable by synchronizing pulses, a capacitor being charged and subsequently discharged, between two threshold levels. The oscillator is switchable between two states under the influence of a synchronizing signal detector which establishes the presence of the syncrhonizing pulses, to wit a first state in the absence of the synchronizing pulses wherein the free-running frequency of the oscillator is substantially equal to the nominal repetition frequency of said pulses and a second state in the presence of the synchronizing pulses wherein the free-running frequency of the oscillator is lower than said nominal repetition frequency, the oscillator being thus in its second state synchronizable by the synchronizing pulses.

16 Claims, 4 Drawing Figures

SAWTOOTH GENERATOR SWITCHABLE BETWEEN A FREE-RUNNING STATE OR A SYNCHRONIZABLE STATE

This is a continuation of application Ser. No. 089,006, filed Oct. 29, 1979, now abandoned.

BACKGROUND OF THE INVENTION

The invention relates to a circuit arrangement for generating a sawtooth shaped voltage across a capacitor. The invention provides charging current means for charging said capacitor until a first threshold voltage is reached and a discharging current means subsequently discharging the capacitor until a second threshold voltage is reached. Additionally means are provided for measuring and controlling the capacitor voltage and for switching said charging and discharging current means, respectively, the free-running frequency of the sawtooth voltage thus generated being determined by the difference between said first and second threshold voltages at constant charging and discharging currents or alternatively said frequency is determined by the intensity of said charging and discharging currents, respectively, at a constant difference between said first and second threshold voltages.

Such a circuit arrangement, which is known from British Patent No. 1,245,552, has the advantage that, except for the capacitor, it does not comprise a frequency-determining element so that integration thereof in a semiconductor body is possible, which furnishes a standard circuit usable for different frequencies and which requires few input and output terminals. It is, for example, possible to use circuits which are identical but for the capacitor, for generating, in a television receiver, a sawtooth voltage at field frequency for the vertical deflection, a sawtooth voltage at line frequency for the horizontal deflection, and a sawtooth voltage for controlling the switch in a switched-mode power supply, the frequencies of the generated voltages being, for example 50 Hz, 15,625 Hz (European standard) and 18 kHz, respectively. These three sawtooth oscillators can be advantageously integrated in one and the same semiconductor body.

Setting the frequency of the generated sawtooth is rather simple in the known circuit: at a constant charging and discharging current the difference between the first and the second threshold voltage is set to a certain value. This results in a certain amplitude of the sawtooth and it will be clear that this determines the frequency. It is also clear that the frequency can be controlled by a control of this amplitude. Such a control can be used in a loop for an indirect synchronization circuit wherein a phase discriminator converts a phase difference between the sawtooth generated by the oscillator and incoming synchronizing pulses into a control voltage which influences the amplitude of the sawtooth in such a manner that said phase difference becomes smaller. This can, for example, be effected because one of the threshold levels is shiftable under the influence of the control voltage whereas the other threshold level remains constant. At a constant amplitude of the sawtooth the charging or discharging current, can be controlled in a similar manner.

A frequency control as outlined in the preceding paragraph always has a certain inertia and always causes a small phase difference which cannot be fully eliminated. Furthermore, a control is hard to realize for comparatively low frequencies. For a field frequency of, for example, 50 Hz the control voltage should remain constant for 20 ms.

It is an object of the invention to provide a sawtooth oscillator of the type defined above, whose frequency can be influenced by direct synchronization and which, consequently, need not satisfy critical requirements. The invention is based on the recognition to choose an oscillator which, in the absence of synchronizing pulses, has a free-running (natural) frequency which is substantially equal to the nominal repetition frequency of said pulses. Nominal frequency is here understood to mean the frequency which the pulses should have, for example in accordance with a standard, although in practice they can deviate somewhat therefrom owing to tolerances. This approach has the advantage that the oscillator can be set in a simple manner without a synchronizing signal as the frequency thereof is the same as the frequency in the synchronized state with a synchronizing signal. Furthermore, should the synchronizing signal disappear temporarily for some reason the oscillator continues to keep the nominal frequency of this signal.

If, however, the natural frequency of the oscillator varies in the absence of a synchronization signal, for example owing to tolerances, ageing of components or due to temperature effects, in such a manner that the natural frequency assumes a value which is higher than the nominal value, then the oscillator would not be synchronizable without further measures, as now the period of the sawtooth is shorter than the time interval between two consecutive synchronizing pulses.

BRIEF DESCRIPTION OF THE INVENTION

It is an object of the invention to enable a direct synchronization also when the natural frequency of the generated sawtooth voltage is higher than the frequency of the synchronizing pulses. To this end the circuit arrangement according to the invention comprises further a synchronizing signal detector for establishing the presence of synchronizing pulses having a substantially constant nominal repetition frequency and for switching the circuit arrangement between a first state in the absence of said synchronizing pulses wherein the free-running frequency of the sawtooth voltage is substantially equal to the nominal repetition frequency of said synchronizing pulses and a second state in the presence of said synchronizing pulses wherein the free-running frequency of said sawtooth voltage is lower than said nominal repetition frequency, the circuit arrangement being thus in its second state synchronizable by said synchronizing pulses.

The circuit arrangement according to the invention may further comprise a comparison stage for comparing the sawtooth voltage with a reference voltage, whereby in the first state of the circuit arrangement the discharge of the capacitor is initiated and the reference voltage is switched to be made equal to the second threshold voltage when the sawtooth voltage reaches the first threshold voltage and the discharge of the capacitor is initiated and the reference voltage is switched to be made equal to the first threshold voltage when the sawtooth voltage reaches the second threshold voltage.

The circuit arrangement according to the invention is further characterized in that the charging and discharging current, respectively, are substantially constant, the difference between said first and second threshold voltage being larger in the second state of the circuit arrangement than in the first state thereof or in that the difference between said first and second threshold voltage is substantially constant and that at least one of the charging and discharging current has a lower intensity in the second state of the circuit arrangement than in the first state thereof.

BRIEF DESCRIPTION OF THE DRAWING

The invention will now be further explained by way of non-limitative example with reference to the accompanying Figures wherein.

DESCRIPTION OF THE PREFERRED EMBODIMENTS

Figure 1:
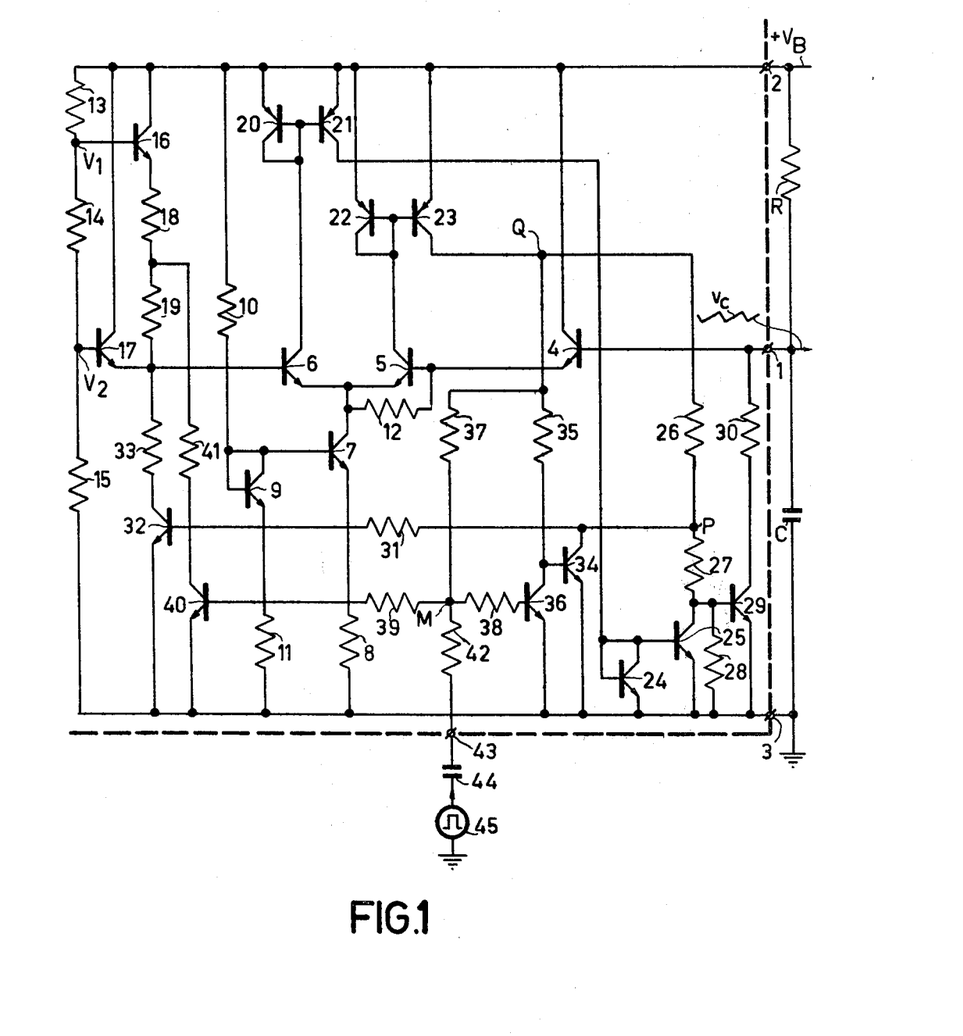
FIG. 1 shows a first embodiment of the circuit according to the invention.

The sawtooth oscillator shown in FIG. 1 forms part of a semiconductor body wherein all components of the oscillator, a resistor R and a capacitor C excepted, are integrated and which is represented within a dotted line. Resistor R and capacitor C constitute a series arrangement provided between the terminals of a supply voltage source $V_B$. A terminal 1 of the semiconductor body is connected to the junction of resistor R and capacitor C whereas a terminal 2 is connected to the positive terminal and a terminal 3 to the negative terminal of source $V_B$ and also to ground.

Terminal 1 is connected to the base of a transistor 5 via an emitter follower transistor 4. It should be noted that the transistors of the Figures, some transistors mentioned hereafter excepted, are of the npn type. Transistor 5 forms a comparison stage together with a further transistor 6. To this end the emitters are interconnected and connected to the collector of a transistor 7 which, in conjunction with an emitter resistor 8, operates as a constant current source. The base of this transistor is connected to the base and to the collector of a transistor 9 and also to a resistor 10 whose other end is connected to voltage $V_B$. The emitter of transistor 9 is connected to ground via a resistor 11. Also that terminal of resistor 8 which is not connected to the emitter of transistor 7 is connected to ground. A resistor 12 is arranged in parallel with the base-emitter diode of transistor 5 to improve the turn-off properties of transistor 4.

The series arrangement of three resistors 13, 14 and 15 is included between terminals 2 and 3. The junction of resistors 13 and 14 which, in operation, carries a voltage $V_1$ is connected to the base of a transistor 16 whereas the junction of resistors 14 and 15 which, in operation, carries a voltage $V_2$ which is lower than voltage $V_1$ is connected to the base of a transistor 17. The emitter of transistor 17 is connected directly to the base of transistor 6 and to the emitter of transistor 16 via two series-arranged resistors 18 and 19 whereas the collectors of transistors 4, 16 and 17 are connected to voltage $V_B$.

The collector of transistor 6 is connected to the bases of two pnp transistors 20 and 21 the emitters whereof are connected to voltage $V_B$. Transistors 20 and 21 form a current mirror carrying over collector current variations of transistor 6. In a similar manner the collector of transistor 5 is connected to the bases of two pnp transistors 22 and 23 the emitters whereof are connected to voltage $V_B$. The collector and the base of transistors 20 and 22, respectively, are interconnected. The collector of transistor 21 is connected to the base and to the collector of a transistor 24 and also to the base of a further transistor 25. The emitters of transistors 24 and 25 are connected to ground. The collectors of transistors 23 and 25 are interconnected via two series-arranged resistors 26 and 27. The collector of transistor 25 is also connected to a resistor 28 and to the base of a transistor 29. The other terminal of resistor 28 and the emitter of transistor 29 are connected to ground, whereas a resistor 30 is included between the collector of this transistor and terminal 1.

A base resistor 31 of a transistor 32 is connected to a junction P of resistors 26 and 27 and a collector resistor 33 of transistor 32 is connected to the base of transistor 6. The collector of a transistor 34 is also connected to point P. A resistor 35 is connected between the collector of transistor 23 (identified as point Q) and the base of transistor 34 and the series arrangement of two resistors 37 and 38 is arranged between point Q and the base of a further transistor 36. The collector of transistor 36 is connected to the base of transistor 34. A base resistor 39 of a transistor 40 is connected to the junction M of resistors 37 and 38 whereas a collector resistor 41 thereof is connected to the junction of resistors 18 and 19. The emitters of transistors 32, 34, 36 and 40 are connected to ground. Finally, point M is connected via a separating resistor 42 to a terminal 43 to which a synchronizing signal source 45, which may also form part of the same semiconductor body as the described oscillator, can be connected via a coupling capacitor 44.

During operation a sawtooth shaped voltage $v_c$ is available at terminal 1. To this end capacitor C is charged by a current flowing through resistor R. Voltage $v_c$ increases in a substantially linear manner. The current through resistor R is assumed to be substantially constant, which is justified if the value of the resistor is comparatively high. As long as voltage $v_c$ is lower than voltage $V_1$ transistors 4 and 5 remain cut off, whereas transistor 6 conducts. The base current thereof is the emitter current of transistor 16 which operates as an emitter follower. Because this current is small the voltage at the base of transistor 6 is substantially equal to $V_1-v_{be}$, $v_{be}$ being the substantially constant threshold voltage of a conducting base-emitter diode, in this case the base-emitter diode of transistor 16. The constant collector current of transistor 7 is the emitter current of transistor 6. Transistors 20, 21 and 24 also conduct. Because transistor 5 is non-conducting, transistors 22 and 23 are also non-conducting. The base voltage of transistor 25 is low because of transistor 24 being conductive, so that also transistor 25 is cut-off. Also transistors 29 and 32 are cut off.

If no synchronizing signal is applied to terminal 43 the voltage at point M is too low for transistors 36 and 40 to conduct, so that transistor 34 is also non-conducting. Transistor 17, whose emitter voltage exceeds the base voltage, is cut off.

At an instant which is determined, with respect to the starting instant of the charging process, by the time constant of the network formed by elements R and C, voltage $v_c$ reaches the value $V_1$. This means that the voltage at the base of transistor 5 is equal to $V_1-v_{be}$ and, consequently, equal to the voltage at the base of transistor 6. In these circumstances transistors 4 and 5 start conducting, so that also transistors 22 and 23 conduct, whereas the emitter current of transistor 6 decreases.

Current flows through resistors 26, 27 and 28 and the voltage at point P increases. As soon as this voltage has reached the value $v_{be}$ transistor 32 becomes conductive. Since transistor 23 now conducts a current can flow to the base of transistor 36 through resistors 37 and 38, which renders transistor 36 conductive while the voltage at point M is positive. The collector current of transistor 36 flows through resistor 35 so that the voltage at the collector is kept at a very low value. This collector current is much higher than the current which would flow to the base of transistor 34 through resistor 35 if this transistor would have become conductive at said instant, so that it is ensured that transistor 34 remains cut off and does not prevent transistor 32 from becoming conductive. The collector currents of transistors 20, 21 and 24 decrease, which causes transistor 25 to conduct. This transistor maintains transistor 29 cut off.

The collector current of transistor 32 flows through resistors 18, 19 and 33 so that the voltage at the base of transistor 6 decreases, causing a further decrease of the emitter current thereof and a further increase of the emitter current of transistor 5. From this it is apparent that the described effect is cumulative and results in a very rapid cut off of transistor 6 and, consequently, of transistors 20, 21, 24 and 25.

The voltage at the base of transistor 29 was substantially zero because of the fact that transistor 25 was conducting. At the instant at which this voltage, after voltage $v_c$ has reached the value $V_1$, reaches the value $v_{be}$ transistor 29 is made conductive by a current flowing through resistor 27. Capacitor C discharges and voltage $v_c$ decreases in a substantially linear manner with a time constant which depends on the values of elements R, C and 30, at the condition that the charging current flowing through resistor R is smaller than the collector current of transistor 29.

Resistors 18, 19 and 33 have been chosen so that the voltage at the base of transistor 6 would decrease to below the value $V_2-v_{be}$, because of the fact that transistor 32 becomes conductive. However, due to the fact that transistor 17 then becomes conductive, said voltage cannot decrease further. Finally, transistor 40 is supplied with a base current through resistors 37 and 39 as a result of which the transistor remains conductive, so that its collector current causes a further decrease of the voltage at the junction of resistors 18 and 19. Because the voltage at the base of transistor 6 is clamped at the value $V_2-v_{be}$ by transistor 17 the fact that transistor 40 conducts has no influence thereon. The described situation of the circuit of FIG. 1 is maintained during discharging of the capacitor C. Any positive synchronizing pulse occurring in this period of time would not have any effect since it would not change the state of transistors 36 and 40.

At the instant at which voltage $v_c$ reaches the value $V_2$ the voltages at the bases of transistors 5 and 6 become equal. Transistor 6, and, consequently, also transistors 20, 21 and 25 start conducting whereas the emitter current of transistor 5 decreases. Because of the fact that transistor 25 conducts transistor 29 is cut off, causing the discharge of capacitor C to stop and voltage $v_c$ to increase again. Since transistor 5 conducts to a lesser extent, also transistors 22 and 23 conduct to a lesser extent so that the voltages at point P and Q decrease, causing a decrease of the collector current of transistor 32 and, consequently, an increase of the voltage at the base of transistor 6, in response to which the emitter current of transistor 6 increases still further. So this effect is cumulative and causes transistors 4, 5, 22, 23, 25 and 32 to be cut off very rapidly. Because of the increasing voltage at the base of transistor 6 also transistor 17 is cut off so that said voltage assumes approximately the value $V_1-v_{be}$. Also transistors 36 and 40 are cut off because of the voltage at point Q becoming zero.

Figure 2:
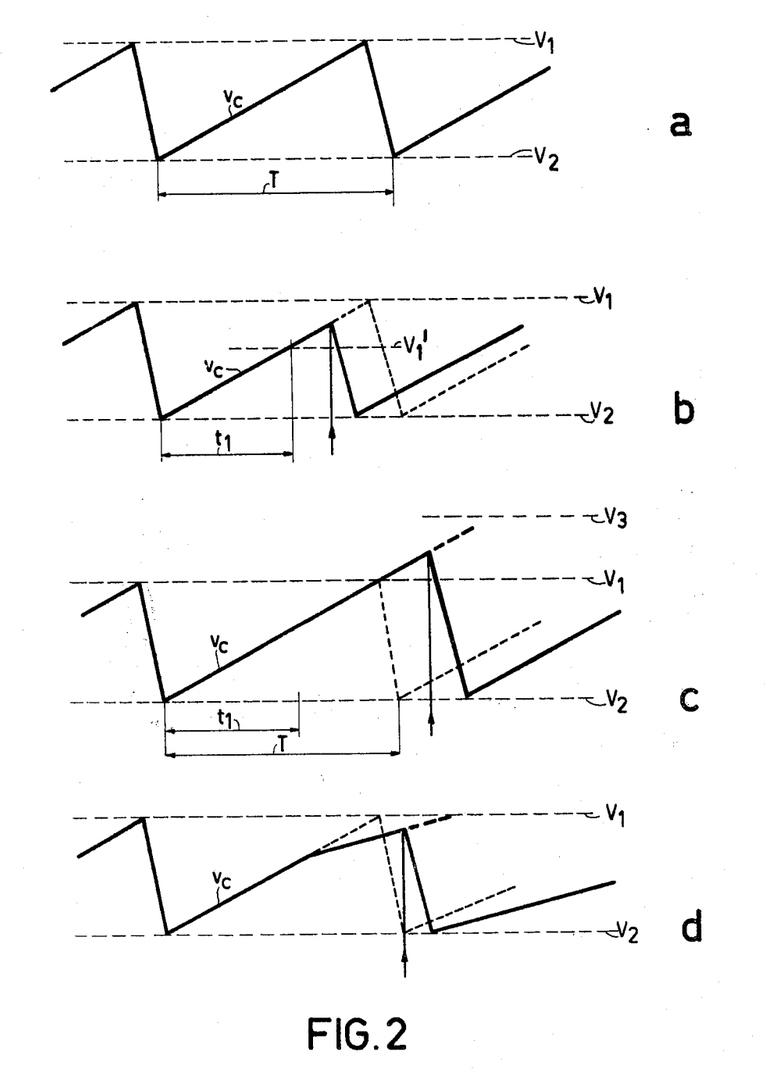
FIG. 2 shows waveforms occurring in the circuit according to the invention.

The foregoing shows that the circuit of FIG. 1 behaves, in the absence of a synchronizing signal, as a free-running sawtooth oscillator which generates a sawtooth shaped voltage $v_c$ at terminal 1. This voltage which is plotted in FIG. 2a as a function of the time, varies between two substantially constant values $V_1$ and $V_2$. The period T of the free oscillation and, consequently, the free-running frequency $f=1/T$ is determined by the values of voltages $V_1$ and $V_2$ and by the values of the above-mentioned time constants, the nominal frequency of the synchronizing pulses being chosen for this free-running frequency, furnishing the above-mentioned advantages. If, for example, the oscillator of FIG. 1 is the field oscillator in a television receiver 50 Hz is chosen for f (European standard). The same circuit can be used for the line oscillator the elements being dimensioned for f=15,625 Hz (European standard). In practice both circuits will be implemented in an identical or substantially identical manner, however with the exception of the external components R and C.

In spite of the fact that the oscillator has the nominal frequency it must be possible to synchronize it. This is necessary during starting-up of the receiver after actuation thereof. Frequency changes may also occur, at the transmitter side, for example when switching the receiver to another transmitter, as well as at the receiver side, for example owing to tolerances, ageing of components etc. In addition, should the free-running frequency of the oscillator increase to above the nominal frequency, for example because the charging current of capacitor C has become larger and, consequently, the rising edge of the sawtooth shape in FIG. 2a has become steeper, it would not be possible to synchronize the oscillator as a synchronizing pulse would not be produced until after reversal of the sawtooth and could, consequently, not exert any influence.

If a synchronizing signal is present at terminal 43 the voltage at point M is continuously determined after the occurrence thereof by this signal. For positive going pulses this voltage assumes a certain value during the brief occurrence thereof, whereas it assumes a lower value for the rest of the period of the synchronizing signal. The amplitude of the synchronizing pulses and the values of resistors 38, 39 and 42 are chosen so that the lower value of the voltage at point M does not affect the state of transistors 34, 36 and 40 whereas the higher voltage value does affect the state of these transistors. Said transistors remain cut off during the rising edge of the sawtooth of FIG. 2a.

If a synchronizing pulse occurs while voltage $v_c$ has not yet reached the value $V_1$ then the voltage at point M assumes its higher value. This causes transistor 40, whose collector resistor 41 is connected to a positive voltage, to become conductive whereas transistors 34 and 36, whose collectors do not carry a voltage, do not pass a collector current. Because of the collector current of transistor 40 flowing through resistors 18 and 41 the voltage drop across resistor 18 becomes higher, so that the voltage at the junction of resistors 18 and 19 is decreased for a short period of time, namely to a value $V'_1$ which is determined by the ratio of the values of resistors 18 and 41 and is located between $V_1-v_{be}$ and $V_2-v_{be}$. If this value is lower than or equal to the value of voltage $v_c$ at the same instant, reduced by $v_{be}$ then transistors 4 and 5, which were cut off, become conductive so that the falling edge of the sawtooth is very rapidly initiated. If, on the contrary, voltage $V'_1$ is higher than the instantaneous value of $v_c-v_{be}$, the synchronizing pulse has no influence and voltage $v_c$ continues to increase. So the value $V'_1$ determines the time interval $t_1$ after the starting instant of the rising edge whereas and whereafter the oscillator of FIG. 1 can be synchronized by a synchronizing pulse. FIG. 2b shows the case that the pulse, indicated by means of an arrow, occurs after interval $t_1$ but prior to the instant at which voltage $v_c$ reaches the value $V_1$. In this case the repetition frequency of the synchronizing pulses is higher than the natural, free-running frequency of the oscillator.

If a synchronizing signal is indeed present but a pulse has not yet occurred after interval $t_1$ at the instant at which voltage $v_c$ reaches the value $V_1$ then, as stated above, transistors 4, 5, 22, 23 and 25 become conductive. The voltage at point M still has its lower value so that transistors 36 and 40 which, in the absence of the synchronizing signal, would be driven and kept conductive by a current flowing through resistor 37 will now remain in the cut off state. However, a current flows from point Q to the base of transistor 34 through resistor 35 so that transistor 34 is driven into conduction. Because the collector resistor 26 of this transistor is connected to the positive voltage prevailing at point Q, the voltage drop across this resistor causes the voltage at point P to become substantially zero. Consequently, transistors 25, 29 and 32 remain cut off which results on the one hand in that voltage $v_c$ continues to increase and comes above the value $V_1$ and on the other hand that the voltage at the base of transistor 6 keeps the value $V_1-v_{be}$.

At the instant at which a synchronizing pulse occurs the voltage at point M increases to above the value, i.e. approximately $v_{be}$, at which transistors 36 and 40 become conductive. The voltage at the collector of transistor 36 becomes substantially zero so that transistor 34 is cut off. The voltage at point P becomes positive and transistors 29 and 32 also start conducting, which initiates the discharge of capacitor C, whereas the voltage at the base of transistor 6 assumes the value $V_2-v_{be}$. It should be noted that the voltage at the junction of resistors 18 and 19 briefly assumes the value $V'_1$ but this is of no importance as the voltage at the base of transistor 6 keeps the value $V_2-v_{be}$ during the entire discharge of capacitor C. FIG. 2c shows the case described above, the frequency of the synchronizing pulses being lower than the free-running frequency of the oscillator. The same situation may occur if one synchronizing pulse is produced within interval $t_1$ and one after voltage $v_c$ has assumed the value $V_1$, while the frequency of the pulses is not below the natural frequency of the oscillator.

If no synchronizing pulse occurs after voltage $v_c$ has exceeded the value $V_1$, voltage $v_c$ continues to increase. This is shown in FIG. 2c by means of a dashed line. The final value of voltage $v_c$ is voltage $V_B$ and a free change-over of the oscillator does not take place. This may be undesirable for many applications, for example for television, where the deflection would stop. This is prevented in FIG. 1 by a capacitor 44 provided between the source 45 of the synchronizing signal and terminal 43. Owing to the presence of capacitor 44 there is present at the terminal 43 a d.c. voltage which is equal to the average value of the pulse-shaped signal generated by source 45 and which is, consequently, zero in the absence of this signal. This d.c. voltage is too low to render transistors 36 and 40 conductive. At the instant at which voltage $v_c$ reaches the value $V_1$, transistor 23 starts conducting and a charging current flows to capacitor 44 via resistors 37 and 42. This causes the voltage at terminal 43 to increase until transistor 36 becomes conductive, which causes the change-over of the oscillator. The choice of the time constant of the network formed by resistors 37 and 42 and capacitor 44 determines the instant and, consequently, the threshold value above $V_1$ at which this change-over is effected, whereafter the capacitor discharges via resistors 42, 38 and 39 to the average value of the synchronizing signal.

Figure 3:
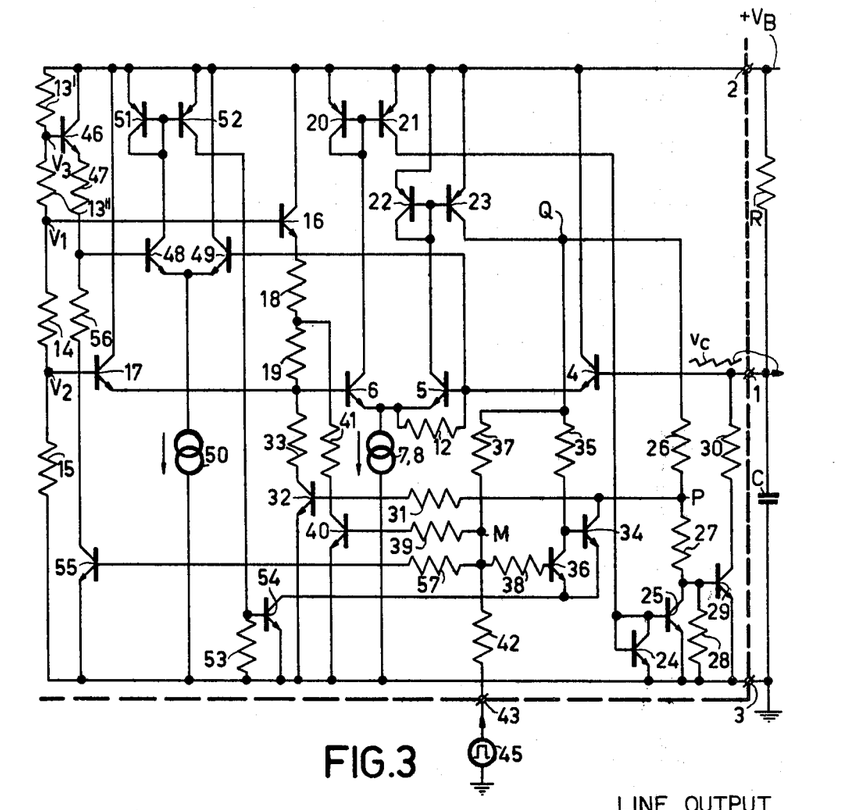
FIG. 3 shows a second embodiment of the circuit according to the invention.

The circuit of FIG. 3 does not require a coupling of source 45 by means of a capacitor 44 having a value chosen as explained above. A large portion of the circuit in FIG. 3 has not been altered with respect to FIG. 1 and the same elements have been given the same reference numerals.

In FIG. 3 the resistor 13 of FIG. 1 has been replaced by the series arrangement of two resistors 13' and 13'' at the junction whereof a voltage $V_3$ is present during operation which is higher than the voltage $V_1$ present at the junction of resistors 13'' and 14. The first-mentioned junction is connected to the base of a transistor 46 whose collector is connected to voltage $V_B$ and whose emitter is connected to the base of a transistor 48 via a resistor 47. Transistor 48 constitutes together with a further transistor 49 a comparison stage. To this end the emitters are interconnected and connected to a current source 50. The collector of transistor 49 is connected to voltage $V_B$ whereas the collector of transistor 48 is connected to the bases of two pnp transistors 51 and 52 whose emitters are connected to voltage $V_B$. The collector of transistor 51 is connected to the base thereof and the collector of transistor 52 is connected to a resistor 53 and to the base of a transistor 54. The other terminal of resistor 53 and the emitter of transistor 54 are connected to ground, while the collector thereof is connected to the emitters of transistors 34 and 36, which are not connected to ground as is the case in FIG. 1. Finally, the oscillator of FIG. 3 comprises a transistor 55 whose emitter is connected to ground, whereas the collector is connected to the base of transistor 48 via a resistor 56 and the base to point M via a resistor 57.

As long as voltage $v_c$ is lower than voltage $V_1$ transistor 48 conducts while transistors 49 and 55 are cut off so that also transistors 51, 52 and 54 conduct. The emitters of transistors 34 and 36 have substantially the ground potential. This is the situation already described hereinbefore in which voltage $v_c$ continues to increase. In the absence of a synchronizing signal transistor 55 becomes conductive because of a current through resistors 37 and 57 at the instant at which voltage $v_c$ reaches the level $V_1$ so that the voltage at the base of transistor 48, which had substantially the value $V_3-v_{be}$, is decreased. The values for resistors 47 and 56 have been chosen so that the new value of said voltage is lower than the value $V_1-v_{be}$, so that transistors 48, 51, 52 and 54 are rendered non-conductive in the cumulative manner described hereinbefore, resulting in that the emitters of transistors 34 and 36 are no longer connected to ground and that these transistors are also cut off. The voltage at point P becomes positive which causes transistors 29 and 32 to become conductive and, consequently, initiates the discharge of capacitor C to voltage $V_2$ in the manner as was the case in FIG. 1.

If a synchronizing signal is present at terminal 43 a pulse, produced after an interval determined in the same manner as $t_1$ in FIG. 2b and prior to voltage $v_c$ becoming equal to $V_1$, causes the oscillator to change-over in the same manner as described in the preceding paragraph. If the pulse has not yet occurred at the instant at which voltage $v_c$ becomes equal to $V_1$ then transistors 36 and 55 remain cut off because the voltage at point M is low, while transistor 34 is rendered conductive by a base current flowing through resistor 35. The voltage at point P is zero, which keeps transistors 29 and 32 in the cut off condition. Voltage $v_c$ continues to increase until a synchronization pulse occurs or until the value $V_3$ is reached. In the latter case the voltages at the bases of transistors 48 and 49 become equal to one another, which causes transistor 49 to start conducting, resulting in the change-over of the oscillator.

Because the variant of FIG. 3 does not require a coupling capacitor between source 45 and terminal 43, the latter can be wholly dispensed with in the case that also source 45, for example a synchronizing pulse separator, forms part of the semiconductor body wherein the described sawtooth oscillator is integrated.

In FIG. 1 transistor 36 has for its purpose to prevent transistor 34 from becoming conductive, which transistor would prevent the oscillator from changing-over at $v_c = V_1$, namely in the absence of a synchronizing signal or in the presence thereof, if a synchronizing pulse has not yet occurred at $v_c = V_1$. Transistors 36 and 54 have the same task in FIG. 3. Transistor 36 or transistors 36 and 54 establish the presence of the synchronizing signal and ensure that level $V_1$ can be exceeded if necessary. If no synchronizing signal is present at terminal 43 capacitor C is charged and voltage $v_c$ increases, as shown in FIG. 2a, to the value $V_1$. If the signal has still not occurred at the instant that voltage $v_c$ reaches said value $V_1$ the oscillator changes-over. If, on the contrary, a synchronizing signal has arrived prior to that instant and if a pulse occurs the oscillator changes over as shown in FIG. 2b. In the nominal state of the oscillator as well as the synchronizing pulses, wherein the natural frequency of the oscillator is equal to the repetition frequency of the pulses, the subsequent change-over of the oscillator will take place as shown in FIG. 2a, that is to say after a period of time T. In practice this condition will be deviated from so that the subsequent change-over takes place either again as shown in FIG. 2b or as shown in FIG. 2c, in which case the value $V_1$ is exceeded by voltage $v_c$.

In the foregoing one of the threshold voltages is, as it were, shifted to another value in the case a synchronizing pulse could be expected from a certain instant but has not yet occurred at the instant at which $v_c = V_1$. This causes the amplitude of the sawtooth to be increased and, consequently, the natural frequency of the oscillator to be reduced. This reduction can be effected in the manner outlined in FIG. 2d. The above-mentioned amplitude, that is to say the difference between voltages $V_1$ and $V_2$ remain substantially constant in all circumstances, whereas one of the slopes, preferably the slope of the rising edge, of the sawtooth can be subjected to a change. If no synchronizing signal is present at the starting instant of a charging period then capacitor C is charged by a current having a certain value. If, during charging, the presence of a synchronizing signal, for example in the manner described with reference to FIGS. 1 and 3, is ascertained then the charging current gets a lower value at the same instant, so that the rising edge of the sawtooth becomes less steep. This corresponds to a lower natural frequency of the oscillator. At the occurrence of the synchronizing pulse the oscillator changes over in the manner described above, whereafter a new charging period starts, the charging current having its lower value if the synchronizing signal is still present.

The foregoing can be effected by replacing resistor R by, for example, the series arrangement of two resistors one of which can be short-circuited by a transisor in the situation that no synchronizing signal is present. Alternatively, resistor R can be replaced by a real current source, implemented with transistors and resistors and which can assume two values. It will be clear that in the case of FIG. 2d the charging device of capacitor C will preferably be included in the semiconductor body. It should be noted that with this implementation, which is not further described in detail, a sawtooth is produced in accordance with FIG. 2d which has at least one bend. However, this need not be a drawback: such a distortion may be permissible for some applications. An example thereof is the field deflection in television receivers wherein the actual field oscillator, whose signal has a constant amplitude and is amplified by a power amplifier before it is supplied to a deflection coil, is supplied with the signal originating from a sawtooth generator synchronizable by synchronizing pulses, which generator may be the generator according to the invention.

Figure 4:
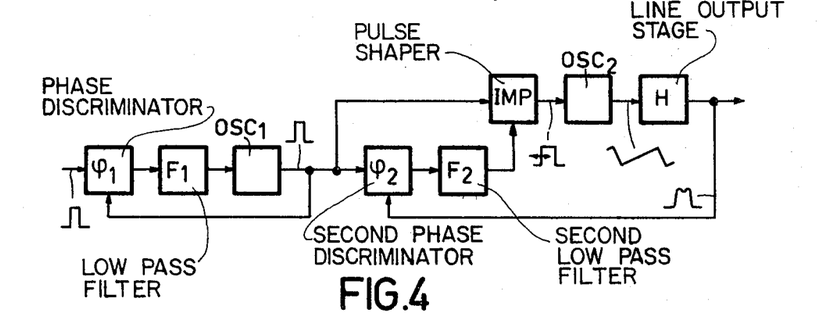
FIG. 4 shows a possible use of the circuit according to the invention.

FIG. 4 shows in broad lines another possible use of the circuit according to the invention. The figure relates to a circuit for the indirect line synchronization in a television receiver wherein received line synchronizing pulses and pulses generated by a line oscillator $OSC_1$ are compared in a phase discriminator $\phi_1$. Discriminator $\phi_1$ converts a phase difference it has ascertained into a control voltage which, after having been smoothed by a low-pass filter $F_1$ is applied to oscillator $OSC_1$. The pulses thereof, which have approximately the proper frequency and the proper phase with respect to the line synchronizing pulses are applied to a second phase discriminator $\phi_2$ wherein they are compared with the pulses originating from the line output stage H. After having been smoothed by a second low-pass filter $F_2$ the output voltage of discriminator $\phi_2$ arrives at a pulse shaper IMP which is supplied with the pulses originating from $OSC_1$. The pulses of pulse shaper IMP synchronize a sawtooth oscillator $OSC_2$, which is implemented as shown in FIG. 1 or FIG. 3 and the sawtooth voltage generated thereby is applied to stage H wherein it is converted into a switching signal which is applied to a line output transformer. A deflection coil, not shown, for the horizontal deflection is connected to this transformer.

The principle of such a double loop for the indirect line synchronization and the operation thereof are extensively described in the U.S. Pat. No. 3,891,800 wherein the output voltage of the second phase discriminator directly influences the second oscillator while a pulse shaper to which signals of the first oscillator might be applied is fully dispensed with. The operation of the second loop ensures that the influence of variations of the load at the stage H are largely eliminated. Whereas the first oscillator is controlled in dependence on the frequency and on the phase of the synchronizing pulses the second oscillator is controlled in dependence on the phase of the pulses at line frequency, produced in stage H. The second loop introduces by nature a small phase error owing to the fact its gain is not infinite.

If now the second synchronization loop is implemented as shown in FIG. 4 this error is reduced without the necessity of increasing the loop gain, which might result in instability. To this end pulse shaper IMP generates pulses of the same frequency as the pulses generated by oscillator $OSC_1$, the phase position of one edge, for example the leading edge, of each pulse of the stage IMP being controlled by the control voltage originating from filter $F_2$. Thereafter this edge synchronizes oscillator $OSC_2$. In this manner it is ensured that the sawtooth generated by oscillator $OSC_2$ has always the proper frequency, namely the frequency of oscillator $OSC_1$, and the phase determined by the second loop. The only error then remaining is caused by the not-infinite sensitivity of discriminator $\phi_2$, while oscillator $OSC_2$, as it is not controlled but synchronized by a pulse edge, does not introduce a phase error.

What is claimed is:

1. A circuit arrangement for generating a sawtooth shaped voltage across a capacitor, comprising charging current means for charging said capacitor until a first threshold voltage is reached and discharging current means for subsequently discharging said capacitor until a second threshold voltage is reached, means for measuring and controlling the capacitor voltage, and means for switching said charging and discharging current means respectively, the free-running frequency of the sawtooth voltage thus generated being determined by the difference between said first and second threshold voltages and by the intensity of said charging and discharging currents respectively, the circuit arrangement further comprising a synchronizing signal detector connected to said circuit arrangement for establishing the presence of a source of synchronizing pulses connected to said synchronizing signal detector, said synchronizing pulses having a substantially constant nominal repetition frequency, said signal detector switching the circuit arrangement between a first state in the absence of said synchronizing pulses wherein the free-running frequency of the sawtooth voltage is substantially equal to the nominal repetition frequency of said synchronizing pulses and a second state in the presence of said synchronizing pulses wherein the free-running frequency of said sawtooth voltage is lower than said nominal repetition frequency, the circuit arrangement being thus in its second state synchronizable by said synchronizing pulses.

2. A circuit arrangement as claimed in claim 1, further comprising a comparison stage for comparing the sawtooth voltage with a reference voltage, whereby in the first state of the circuit arrangement the charge of the capacitor is initiated and the reference voltage is switched to be made equal to the second threshold voltage when the sawtooth voltage reaches the first threshold voltage and the discharge of the capacitor is initiated and the reference voltage is switched to be made equal to the first threshold voltage when the sawtooth voltage reaches the second threshold voltage.

3. A circuit arrangement as claimed in claim 2, wherein the charging and discharging currents, respectively, are substantially constant, the difference between said first and second threshold voltages being larger in the second state of the circuit arrangement than in the first state thereof.

4. A circuit arrangement as claimed in claim 3, whereby in the second state thereof the capacitor is further charged to a new value of said first threshold voltage, the third threshold voltage, when the sawtooth voltage reaches the first threshold voltage, the difference between said third and second threshold voltage being larger than the difference between said first and second threshold voltage.

5. A circuit arrangement as claimed in claim 4, wherein a first transistor is provided for discharging the capacitor and a second transistor is provided for switching the reference voltage, said first and second transistors remaining by the action of the synchronizing signal detector in the same conduction state in the second state of the circuit arrangement after the sawtooth voltage has reached said first threshold voltage.

6. A circuit arrangement as claimed in claim 5, wherein said first and second transistors are cut off prior to the instant at which the sawtooth voltage reaches said first threshold voltage, a third transistor controlled by the synchronizing signal detector keeping in the second state of the circuit arrangement said first and second transistor in the cut off state after said instant.

7. A circuit arrangement as claimed in claim 6, wherein the synchronizing signal detector comprises a fourth transistor for preventing in the first state of the circuit the third transistor from cutting off said first and second transistors when the sawtooth voltage reaches the first threshold voltage.

8. A circuit arrangement as claimed in claim 7, wherein said fourth transistor prevents said third transistor from inhibiting said first and second transistor during the occurrence of the synchronizing pulses.

9. A circuit arrangement as claimed in claims 7 or 8, wherein said fourth transistor conducts during the discharge of the capacitor and during the occurrence of the synchronizing pulses.

10. A circuit arrangement as claimed in claim 7, wherein a further capacitor is included in a control lead of the fourth transistor, which further capacitor is charged in the second state of the circuit arrangement after the sawtooth voltage has reached said first threshold voltage, the voltage on said further capacitor causing said fourth transistor to be switched when the sawtooth voltage reaches said third threshold voltage.

11. A circuit arrangement as claimed in claim 4, wherein a second comparison stage is provided for comparing the generated sawtooth voltage with a second reference voltage which is equal to said third threshold voltage in the second state of the circuit arrangement when said sawtooth voltage reaches said first threshold voltage.

12. A circuit arrangement as claimed in claim 2, wherein the difference between said first and second threshold voltages is substantially constant and wherein at least one of the charging and discharging currents has a lower intensity in the second state of the circuit arrangement than in the first state thereof.

13. A circuit arrangement as claimed in claim 7, wherein said source of synchronizing pulses is included in a control lead of the fourth transistor.

14. A circuit arrangement as claimed in claim 3, wherein said circuit arrangement comprises an integrated circuit of elements.

15. A circuit arrangement as claimed in claim 11, wherein said first and second reference voltages assume during the occurrence of the synchronizing pulses a value situated between said first and second threshold voltages.

16. A circuit arrangement as claimed in claim 13, wherein the source of synchronizing pulses is a pulse shaper for converting the signal generated by an oscillator which forms part of an indirect synchronization loop into a pulse train, each pulse of said pulse train having an edge whose phase is controlled in dependence on the load on a circuit to which the generated sawtooth voltage is applied, said edge directly synchronizing the circuit.

* * * * *